(12) United States Patent
Ko et al.

(10) Patent No.: US 9,049,792 B2
(45) Date of Patent: Jun. 2, 2015

(54) PROTECTION COVER AND PORTABLE APPARATUS HAVING THE SAME

(71) Applicant: Samsung Electronics Co., Ltd., Gyeonggi-do (KR)

(72) Inventors: Jong-Kwon Ko, Gyeonggi-do (KR); Sang-Geun Kim, Gyeonggi-do (KR); Yong Seo, Gyeonggi-do (KR); Nam-Jun Kim, Incheon (KR); Sang-Woon Nahm, Seoul (KR); Bong-Gun Lee, Busan (KR); Yong-Jin Lee, Gyeonggi-do (KR); Jin-Hee Cho, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 101 days.

(21) Appl. No.: 13/726,921

(22) Filed: Dec. 26, 2012

(65) Prior Publication Data

US 2013/0165190 A1 Jun. 27, 2013

(30) Foreign Application Priority Data

Dec. 26, 2011 (CN) .......................... 2011 2 0576723
Nov. 5, 2012 (KR) .......................... 10-2012-0124409

(51) Int. Cl.
| | |
|---|---|
| *H04M 1/00* | (2006.01) |
| *H05K 5/03* | (2006.01) |
| *G06F 1/16* | (2006.01) |
| *H04M 1/18* | (2006.01) |

(52) U.S. Cl.
CPC ................. *H05K 5/03* (2013.01); *H04M 1/185* (2013.01); *G06F 1/1626* (2013.01); *G06F 2200/1633* (2013.01)

(58) Field of Classification Search
None
See application file for complete search history.

(56) References Cited

U.S. PATENT DOCUMENTS

| | | | |
|---|---|---|---|
| 6,819,549 B1 * | 11/2004 | Lammers-Meis et al. | 361/679.55 |
| 2005/0006212 A1 * | 1/2005 | Han et al. | 200/61.7 |
| 2008/0261664 A1 | 10/2008 | Parry | |
| 2010/0293732 A1 * | 11/2010 | Jiang et al. | 15/147.1 |

FOREIGN PATENT DOCUMENTS

| | | |
|---|---|---|
| JP | 2003046623 A | 2/2003 |
| KR | 20-0238442 Y1 | 7/2001 |
| KR | 20-0394683 Y1 | 8/2005 |
| KR | 20-0455045 Y1 | 8/2011 |

* cited by examiner

*Primary Examiner* — Suhail Khan
(74) *Attorney, Agent, or Firm* — Cha & Reiter, LLC

(57) ABSTRACT

A protection cover and a portable apparatus including the same are provided. The protection cover includes a front cover, a rear cover, and a coupling member. The front cover is mountable on the portable apparatus and covers a screen of the portable apparatus. The coupling member is formed of a flexible material such that the front cover is pivotable between and open and a closed position. The rear cover is mounted on the backside of the portable apparatus to serve as a rear case of the portable apparatus. The coupling member is integrally coupled with the front cover and separably coupled with the rear cover. According to the above structure, the protection cover can minimize the total volume and dimensions of the portable apparatus after it is mounted.

19 Claims, 4 Drawing Sheets

US 9,049,792 B2

PROTECTION COVER AND PORTABLE APPARATUS HAVING THE SAME

CLAIM OF PRIORITY

This application claims the benefit under 35 U.S.C. §119 (a) from a China patent application filed in State Intellectual Property Office of the People's Republic of China on Dec. 26, 2011 and assigned Serial No. 201120576723.8 and a Korean patent application filed in Korean Intellectual Property Office on Nov. 5, 2012 and assigned Serial No. 10-2012-0124409, the entire disclosures of which are hereby incorporated by reference.

BACKGROUND OF THE INVENTION

1. Field of the Invention

The present invention relates to a protection cover and a portable apparatus having the same.

2. Description of the Related Art

Recently, as electronic technology develops, portable apparatuses employing a touch screen such as a smart phone, a tablet Personal Computer (PC), etc. have emerged. A user may thus realize a desired function by touching the screen of the portable apparatus and manipulating icons and other images represented on the touch screen.

Generally, for a portable apparatus having a touch screen a protection cover is used on the portable apparatus to protect the body and the screen from damage and to keep it clean.

As illustrated in FIG. 1, the conventional protection cover includes a rear cover 3 mounted on a rear case of a portable apparatus 1, and a front cover 2 covering the screen of the portable apparatus 1 which may be joined together or may simply be affixed to the portable apparatus.

However, in the conventional protection cover, since the rear cover 3 is mounted on the rear case (for example, a battery cover) of the portable apparatus 1, a total volume and dimension of the portable apparatus may increase after the protection cover is closed.

Also, the front cover 2 of this kind of protection cover, covering the screen of the portable apparatus 1 does not have a cleaning ability.

SUMMARY OF THE INVENTION

An exemplary aspect of the present invention is to address at least some of the above-mentioned problems and/or disadvantages and to provide at least the advantages described below. Accordingly, an exemplary aspect of the present invention is to provide a protection cover and a portable apparatus including the same, that can be more compact and reduce a total volume after the protection cover is mounted as compared to the conventional art.

Another exemplary aspect of the present invention is to provide a protection cover and a portable apparatus having the same, where the protection cover can clean the screen of the portable apparatus.

Still another aspect of the present invention is to provide a protection cover and a portable apparatus preferably including the same, realized such that the protection cover is installed to replace at least one case frame of the portable apparatus and so is used also for a protection cover to reduce the size of the portable apparatus.

In accordance with an exemplary aspect of the present invention, a protection cover for a portable apparatus is provided. The protection cover preferably includes a front cover for covering a front side on which a screen of the portable apparatus is installed, a rear cover for covering a rear side of the portable apparatus, and a coupling member integrally coupled with the front cover and separably coupled with the rear cover, wherein the rear cover is utilizable as a battery cover.

The coupling member has a fixing member, and the fixing member separably couples the coupling member with the rear cover.

A fixing protrusion is installed on the fixing member, and a coupling hole is formed in the coupling member. A coupling protrusion is formed on the rear cover, and the fixing protrusion is detachably coupled with the coupling protrusion via the coupling hole.

One side of the front cover facing the screen of the portable apparatus may employ a material having a cleaning ability.

One side of the front cover facing the screen of the portable apparatus may employ a fiber material.

One side of the front cover facing the screen of the portable apparatus may employ superfine fibers.

The other side of the front cover facing an outside may employ a leather cover. A mount protrusion is installed on the rear cover, so that the rear cover is mounted on a rear side of the portable apparatus.

The coupling member is formed of a flexible material so that it is bendable upward when the front cover is coupled with the rear cover.

The coupling member is formed of at least one of leather, a synthetic resin, rubber, or silicon material.

In accordance with another exemplary aspect of the present invention, a portable apparatus mounting the above-described protection cover thereon is provided.

Also, an exemplary portable apparatus provided in accordance with the present invention may be a tablet personal computer (PC).

Also, an exemplary portable apparatus provided in accordance with the present invention is a portable phone.

Also, an exemplary portable apparatus provided in accordance with the present invention is a mobile terminal.

Other exemplary aspects, advantages and salient features of certain exemplary embodiments of the PROTECTION COVER AND PORTABLE APPARATUS HAVING THE SAME according to the invention will become apparent to a person of ordinary skill in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings in which.

DETAILED DESCRIPTION OF EXEMPLARY EMBODIMENTS

Hereinafter, a protection cover according to the present invention is descried in detail with reference to the accompanying drawings. In the following description, well-known functions or constructions may not be described in detail when they would obscure appreciation of the present invention by a person of ordinary skill in the art with unnecessary detail of the well-known functions and structures. Also, the terms used herein are defined according to the functions of the present invention as would be understood by a person of ordinary skill in the art. Thus, the terms may vary depending on user's or operator's intension and usage. That is, the terms used herein must be understood based on the descriptions made herein in view of the ordinary level of skill in the art.

Figure 1:
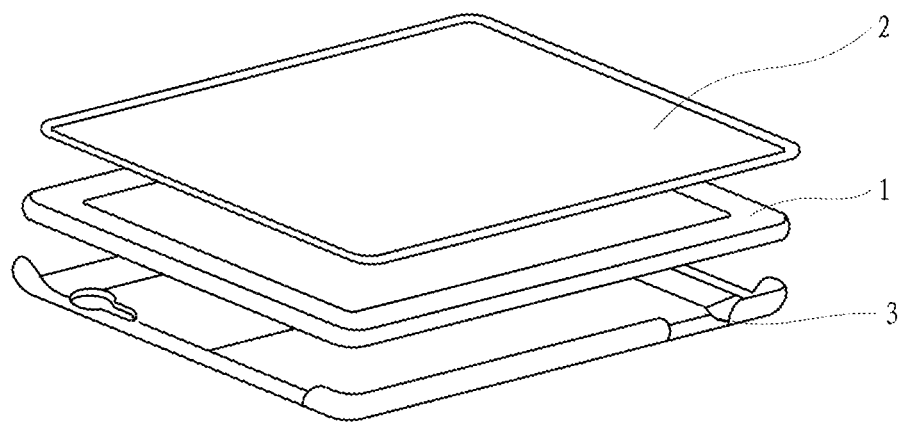
FIG. 1 is an exploded perspective view illustrating a protection cover of the conventional portable apparatus according to the prior art.
Figure 2:
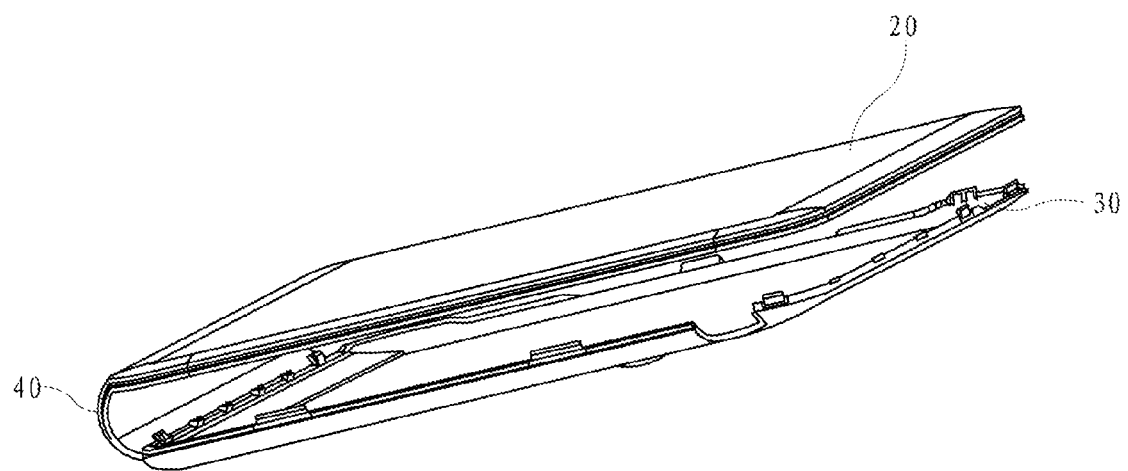
FIG. 2 is a perspective view illustrating a protection cover according to an exemplary embodiment of the present invention.

FIG. 2 is a perspective view illustrating a protection cover according to an exemplary embodiment of the present invention.

Figure 4:
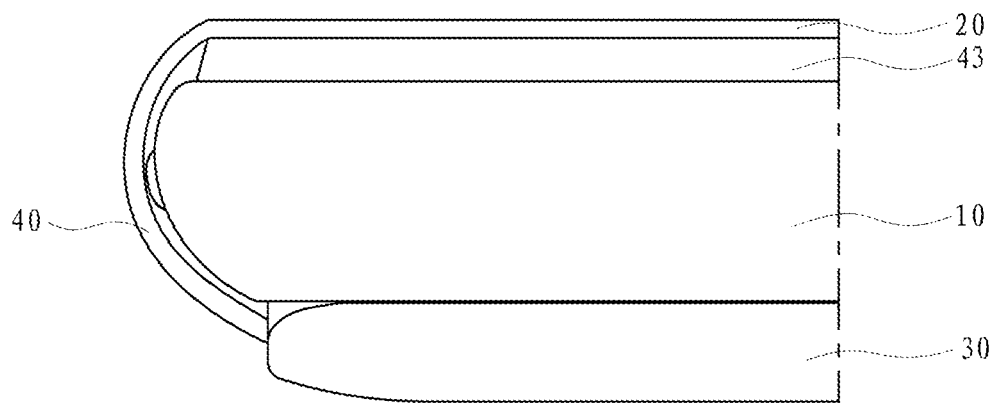
FIG. 4 is a side view illustrating a crucial portion of a protection cover mounted on a portable apparatus according to an exemplary embodiment of the present invention.

As illustrated in FIG. 2, the protection cover includes a front cover 20 for covering a screen, such as a touch screen or visual display screen of a portable apparatus 10, that is depicted in FIG. 4, and not shown in this view, a rear cover 30 mounted on the rear side of the portable apparatus 10 and serving as a rear case frame of the portable apparatus 10, and a coupling member 40 integrally coupled with the front cover and separably coupled with the rear cover 30.

Specifically, the front cover 20 covers the screen of the portable apparatus 10 to protect the screen. Also, the front cover 20 has both an inner side and an outer side. The inner side of the front cover 20, oriented toward the screen of the portable apparatus 10 employs a material having a cleaning capability for the screen. The other side (in other words, an outer side) facing the outside employs or may be covered with a soft resilient material such as, for example leather, however, the material is not limited to leather and may include materials such as nylon, cloth fabric or other similar materials.

Furthermore, the inner side of the front cover 20 may employ a fiber material 43 that is depicted in FIG. 4, and not seen in this view, and preferably, a material having superfine fibers. Here, the superfine fiber denotes a fiber whose diameter is very small, and generally, a fiber whose fineness is 0.3 denier (diameter is 5 micron) or less. Since a gap between fine fibers formed of superfine fibers may adsorb dusts, oil stain, liquids and trash, the fine fibers have a very strong cleaning ability. A superfine fiber has the capacity to remove and adsorb dusts, grains, and liquid as much as seven times of its weight.

Since the inner side of the front cover 20 of the protection cover according to the present invention employs superfine fibers, cleaning may occur when the front cover 20 covers the screen by the protection cover being in close contact with the screen such that the superfine fibers are rubbed against the screen as the cover is moved with respect to the screen when being handled by the user. Such movement can occur when the user is opening or closing the cover or even as a result of minute movements caused by the user handling the portable apparatus 10.

Also, the outer side of the front cover 20 of the protection cover employs a suitable material to provide a tactile feel that is pleasing to the user while also offering a surface that provides sufficient friction with the users hands so that the cover is easy to hold and manipulate while also providing a pleasing appearance and a cushioning or padding capability. Such materials may be leather to raise the appearance quality. This kind of leather may be natural leather, or artificial leather.

However, a material of the outer side of the front cover 20 is not limited to leather but the outer side may be realized using various materials including for example, fabric cloth, nylon or other materials for making the appearance elegant.

The coupling member 40 is integrally formed with the front cover 20 and its end portion is selectively coupled with the rear cover 30. Alternately, in the case where the coupling member 40 is not coupled with the rear cover 20, the rear cover 30 may be used to protect the backside of the portable apparatus 10 independently.

The above-described coupling member 40 is preferably formed of a flexible material. For example, the coupling member 40 may be formed of various materials such as leather, a synthetic resin, rubber, silicon, etc which permit the coupling member 40 to bend and thus allow the front cover to pivot between an open and closed position. In this case, the coupling member may be attached to the front cover or may be integrally formed using insert molding, etc. This is because in the case where the front cover 20 and the rear cover 30 are both simultaneously mounted using the coupling member 40 in order to protect the portable apparatus 10, the front cover 20 should be bent to the upward direction of the portable apparatus 10 into an open position to allow a user to manipulate the screen. The coupling member 40 may in an alternate embodiment include a hinge, which may be a living hinge for example to allow the front cover 20 to pivot between an open and a closed position.

Alternately, the coupling member 40 may be a separate component, not be integrally formed with the front cover 20 and may therefore be separably installed with the front cover 20 and the rear cover 30 to be safely and securely affixed to the portable apparatus 10.

The rear cover 30 of the protection cover according to the present invention is mounted on the backside of the portable apparatus 10 to serve as a rear case frame of the portable apparatus 10. In other words, the rear cover 30 of the present invention operates as the protection cover and simultaneously, operates as the rear case frame of the portable apparatus 10. Here, the rear cover 30 preferably serves as a battery cover of the portable apparatus 10. In accordance with the present invention as will be further explained herein, the rear cover 30 may be constructed and designed such that it replaces the original rear case cover from of the portable apparatus 10. The rear case cover of the portable apparatus may typically be a cover for the battery or the subscriber identity module or other such electronic components. In this way, the protection cover of the present invention can maintain or minimize the slim appearance and dimensions of the portable apparatus 10, while also providing the structure and components required for affixing the coupling member 40 and front cover 20.

Also, a plurality of mount protrusions 32 and 33 are installed on the rear cover 30 to mount the rear cover 30 on the backside of the portable apparatus 10. In addition, a plurality of coupling protrusions 31 are installed on the rear cover 30 to couple with a fixing member 50 which will be described later. While the rear cover and mount protrusions 32 and 33 are shown and described as having a particular shape, orientation and position, one skilled in the art would recognize that the present invention is not so limited. The mount protrusions 32 and 33 may be located and shaped in such as way to adapt to any number of portable apparatus 10, such that the rear cover may be securely affixed to a portable apparatus 10.

Figure 3:
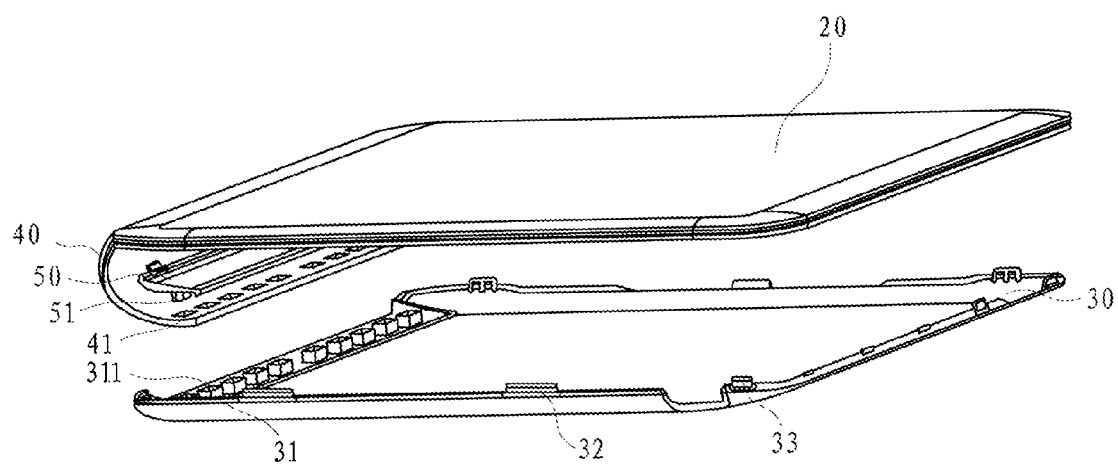
FIG. 3 an exploded perspective view illustrating a protection cover according to an exemplary embodiment of the present invention.

FIG. 3 an exploded perspective view illustrating a protection cover according to an exemplary embodiment of the present invention, and FIG. 4 is a side view illustrating a portion of a protection cover that is mounted on a portable apparatus according to an exemplary embodiment of the present invention. FIG. 4 depicts the portable apparatus 10, the front cover 20, a fiber material 43, the coupling member 40 and the rear cover 30. As shown in FIG. 4, the front cover is in a closed position and overlays the top surface of the portable apparatus 10 where the touch screen is located. In this closed position, the fiber material 43 is in close contact with the touch screen such that it can perform a cleaning operation of the touch screen.

As illustrated in FIGS. 3 and 4, the coupling member 40 and the rear cover 30 of the protection cover are separably connected with each other. Also, the coupling member 40 may be integrally formed with the front cover 20. Alternately, the coupling member and the front cover may be formed independently while the coupling member 40 may be integrally coupled with the front cover 20 via a separably coupling method. Also, coupling holes 41 may be formed in the coupling member 40.

Also, the protection cover further includes the fixing member 50. The fixing member 50 operates to separably couple the rear cover 30 with the coupling member 40. Specifically, fixing protrusions 51 are installed on the underside of fixing member 50 having a spacing and interval that is in alignment with coupling holes 41 and coupling protrusions 31. Fixing protrusions 51 are detachably coupled with the coupling protrusions 31 of the rear cover 30 via the coupling holes 41 located along an edge of coupling member 40. Accordingly, the fixing protrusions 51 separably couple the rear cover 30 with the coupling member 40. Here, the fixing members 51 may be inserted into and so coupled with the coupling protrusions 31 as describe in more detail below.

More specifically, the plurality of coupling protrusions 31 formed along the width of the inner side of the rear cover 30 are spaced apart at predetermined interval and have a consistent spacing to correspond to the coupling holes 41 and coupling protrusions 31 so that the rear cover 30 may be coupled with the coupling member 40. A protrusion seat recess 311 is formed in the center of each coupling protrusion 31 adapted to receive and retain fixing protrusions 51. Fixing protrusions 51 are retained within seat recess 311 by providing a close tolerance interference fit between the fixing protrusion 51 and the seat recess 311.

Also, the coupling holes 41 are formed in the coupling member 40 with a constant interval at positions corresponding to the coupling protrusions 31 in the width direction along an edge of coupling member 40. Therefore, the rear cover 30 is seated on the coupling member 40 in such a way that the coupling protrusions 31 formed on the rear cover 30 pass through the coupling holes 41 of the coupling member 40, so that primary assembling is completed. After that, the fixing member 50 is coupled from the upper portion of the coupling member 40 to the rear cover 20, and the fixing protrusions 51 are fit in the protrusion seat recesses 311 of the coupling protrusions 31 exposed via the coupling holes 41, so that assembling is completed, thereby securely attaching coupling member 40 to rear cover 30. The fixing protrusions 51 may be assembled to the protrusion seat recesses 311 of the coupling protrusions 31 in a forcibly fitting manner by pressing the fixing protrusions 51 into protrusion seat recessed 311.

As illustrated in FIG. 3, the protection cover configured as described above allows the coupling protrusions 31 of the rear cover 30 to pass through the coupling holes 41 of the coupling member 40 integrally formed with the front cover 20, and then couple with the fixing member 50 on the upper portion, and so allows the front cover 20 and the rear cover 30 to couple with each other and be securely retained together. Once securely connected, the portable apparatus 10 is interposed between the front cover 20 and the rear cover 30, and retained within so that assembling is completed.

Preferably, according to the present invention, the rear cover 30 may be used in substitution for a battery cover of the portable apparatus 10 to that the total volume and dimensions of the portable apparatus 10 do not increase. However, the present invention is not limited thereto but the portable apparatus is interposed between the assembled front cover 20 and the rear cover 30, and a separate support means that can support the portable apparatus 10 may be further provided to the rear cover 30. For example, the rear cover 30 may be a thin structure that is affixed to the rear surface of the portable apparatus 10 by way of adhesive or other retaining structures such as clips or tabs that connect to the rear surface of the portable apparatus.

Also, the portable apparatus 10 according to the present invention may be a tablet PC or a portable phone, but is not limited thereto.

Although the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

What is claimed is:

1. A protection cover for a portable apparatus, the protection cover comprising:
   a front cover disposable on a front side adjacent to a touch screen of the portable apparatus;
   a rear cover disposable on a rear side of the portable apparatus, the rear cover including a coupling protrusion formed on an interior wall of the rear cover;
   a coupling member integrally coupled with the front cover and separably attachable to the rear cover; and
   a fixing member configured to couple the coupling member with the rear cover separably,
   wherein the fixing member includes a fixing protrusion aligned with and extending towards a coupling hole formed in the coupling member,
   wherein when the front cover is attached to the rear cover, the coupling protrusion is inserted in the coupling hole, and the fixing protrusion is coupled with the coupling protrusion.

2. The protection cover of claim 1, wherein the rear cover is a rear case cover of the portable apparatus.

3. The protection cover of claim 1, wherein the fixing protrusion is detachably coupled with the coupling protrusion via the coupling hole.

4. The protection cover of claim 1, wherein when the front cover is attached to the rear cover, the fixing protrusion is received in a seat recess of the coupling protrusion.

5. The protection cover of claim 4, wherein the fixing protrusion is retained within the seat recess of the coupling protrusion by a close tolerance interference fit.

6. The protection cover of claim 1, wherein the front cover has an inner surface and an outer surface and wherein the inner surface comprises a material having a cleaning function.

7. The protection cover of claim 6, wherein the material is a fiber material.

8. The protection cover of claim 7, wherein the fiber material is a superfine fiber.

9. The protection cover of claim 6, wherein the outer surface comprises a resilient material cover.

10. The protection cover of claim 9, wherein the resilient material cover is leather.

11. The protection cover of claim 1, wherein a plurality of assembling protrusions are formed on the rear cover and adapted to be attached to the portable apparatus to assemble the rear cover to a backside of the portable apparatus.

12. The protection cover of claim 1, wherein the coupling member is formed of a flexible material so that the front cover is bendable upward when coupled with the rear cover.

13. The protection cover of claim 10, wherein the coupling member includes a hinge.

14. The protection cover of claim 10, wherein the coupling member is formed of at least one of leather, a synthetic resin, rubber, and silicon.

15. The protection cover of claim 1, wherein the coupling member includes a hinge.

16. The protection cover of claim 1, wherein the rear cover is attached to a rear case cover of the portable apparatus.

17. A portable apparatus with a protection cover comprising, the protection cover comprising:
    a front cover disposed on a front side adjacent to a touch screen of the portable apparatus;
    a rear cover disposed on a rear side of the portable apparatus the rear cover including a coupling protrusion formed on an interior wall of the rear cover;
    a coupling member integrally coupled with the front cover and separably coupled with the rear cover; and
    a fixing member configured to couple the coupling member with the rear cover separably,
    wherein the fixing member includes a fixing protrusion aligned with and extending towards a coupling hole formed in the coupling member,
    wherein when the front cover is attached to the rear cover, the coupling protrusion is inserted in the coupling hole, and the fixing protrusion is coupled with the coupling protrusion.

18. The portable apparatus of claim 17, wherein the portable apparatus comprises a tablet personal computer (PC).

19. The portable apparatus of claim 17, wherein the portable apparatus comprises a cellular phone.

* * * * *

UNITED STATES PATENT AND TRADEMARK OFFICE
CERTIFICATE OF CORRECTION

| | | |
|---|---|---|
| PATENT NO. | : 9,049,792 B2 | Page 1 of 1 |
| APPLICATION NO. | : 13/726921 | |
| DATED | : June 2, 2015 | |
| INVENTOR(S) | : Jong-Kwon Ko et al. | |

It is certified that error appears in the above-identified patent and that said Letters Patent is hereby corrected as shown below:

On the Title Page

Item 30, Line 1 should read as follows:
--…Dec. 26, 2011 (CN) 201120576723.8…--

Signed and Sealed this
Twenty-ninth Day of September, 2015

Michelle K. Lee
*Director of the United States Patent and Trademark Office*